US012707916B2

(12) United States Patent
Kim et al.

(10) Patent No.: US 12,707,916 B2
(45) Date of Patent: Aug. 11, 2026

(54) BRUSH ASSEMBLY AND WAFER CLEANING DEVICE INCLUDING THE SAME

(71) Applicant: SAMSUNG ELECTRONICS CO., LTD., Suwon-si (KR)

(72) Inventors: Minseon Kim, Suwon-si (KR); Donghoon Kwon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 503 days.

(21) Appl. No.: 18/237,547

(22) Filed: Aug. 24, 2023

(65) Prior Publication Data

US 2024/0290637 A1 Aug. 29, 2024

(30) Foreign Application Priority Data

Feb. 23, 2023 (KR) ........................ 10-2023-0024390

(51) Int. Cl.

*H10P 72/00* (2026.01)
*A46B 13/00* (2006.01)
*A46B 13/02* (2006.01)

(52) U.S. Cl.

CPC ........ *H10P 72/0412* (2026.01); *A46B 13/001* (2013.01); *A46B 13/008* (2013.01); *A46B 13/02* (2013.01); *A46B 2200/3073* (2013.01)

(58) Field of Classification Search

CPC ...... H10P 72/00; H10P 72/04; H10P 72/0412; H10P 70/56; H10P 70/60; H10P 70/30; A46B 13/00; A46B 13/001; A46B 13/008; A46B 13/02; A46B 13/003; A46B 2200/30

See application file for complete search history.

(56) References Cited

U.S. PATENT DOCUMENTS 1,109,088 A * 9/1914 Taylor ...................... B25J 9/042 15/23
3,562,832 A * 2/1971 Rickard .................. B28B 7/386 15/88.4
6,368,192 B1 * 4/2002 Jones .................. H10P 72/0412 451/66

(Continued)

FOREIGN PATENT DOCUMENTS

JP H119609 A * 1/1999 ..... A61B 17/320068
JP 2002001238 A 1/2002

(Continued)

*Primary Examiner* — C. A. Rivera

(74) *Attorney, Agent, or Firm* — Sughrue Mion, PLLC

(57) ABSTRACT

A brush assembly includes a first brush including a first body that is cylindrical, and a first vertical gear connected to a surface of the cylindrical first body that faces a third body, the first vertical gear being configured to rotate in a first vertical direction, a second brush including a first horizontal gear configured to rotate in a first horizontal direction and a second body connected to a lower portion of the first horizontal gear and rotatably connected to the first body, and a third brush including a second vertical gear connected to a surface of the third body that faces the first body, the second vertical gear being configured to rotate in a second vertical direction that is opposite to the first vertical direction, where the first horizontal gear is engaged with a lower portion of the first vertical gear.

20 Claims, 12 Drawing Sheets

(56) References Cited

U.S. PATENT DOCUMENTS

| | | | |
|---|---|---|---|
| 6,438,781 | B1 | 8/2002 | Ritchey, Jr. et al. |
| 6,598,255 | B1 | 7/2003 | Gohda et al. |
| 9,773,686 | B2 | 9/2017 | Tanaka |
| 10,002,778 | B2 | 6/2018 | Ishibashi |
| 11,004,701 | B2 | 5/2021 | Suemasa |
| 2022/0262620 | A1 | 8/2022 | Huang et al. |

FOREIGN PATENT DOCUMENTS

| | | | |
|---|---|---|---|
| JP | 2010212295 | A | 9/2010 |
| KR | 10-0426184 | B1 | 6/2004 |
| KR | 20150061731 | A | 6/2015 |
| KR | 101600774 | B1 | 3/2016 |

* cited by examiner

BRUSH ASSEMBLY AND WAFER CLEANING DEVICE INCLUDING THE SAME

CROSS-REFERENCE TO RELATED APPLICATION

This application is based on and claims priority to Korean Patent Application No. 10-2023-0024390, filed on Feb. 23, 2023, in the Korean Intellectual Property Office, the disclosure of which is incorporated herein by reference in its entirety.

BACKGROUND

1. Field

Example embodiments of the disclosure relate to a brush assembly and a wafer cleaning device including the same.

2. Description of the Related Art

An integrated circuit may be generally formed by successive deposition of a conductor, a semiconductor, and an insulator on a substrate (e.g., a silicon wafer). After each layer is deposited, each layer is etched to provide a circuit characteristic. As a series of layers are continuously deposited and etched, an exposed surface of the wafer becomes increasingly rough, and a chemical-mechanical polishing (CMP) process may be used to smooth the wafer.

After the CMP process, an impurity (a particle) such as a polishing by-product, a slurry, or the like remains on a surface of the wafer. Therefore, a cleaning process is performed on the surface of the wafer to remove the particle such as the polishing by-product, the slurry, or the like.

The cleaning process may be performed using a brush configured to remove particles. However, the brush used in a related art cleaning processes may have issues in which uniform cleaning is not performed because an area in which the brush contacts the wafer is not uniform.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a brush assembly capable of uniformly cleaning a surface of a wafer and a wafer cleaning device including the brush assembly.

Additional aspects will be set forth in part in the description which follows and, in part, will be apparent from the description, or may be learned by practice of the presented embodiments.

According to an aspect of an example embodiment, a brush assembly may include a first brush including a first body that is cylindrical, and a first vertical gear connected to a surface of the cylindrical first body that faces a third body, the first vertical gear being configured to rotate in a first vertical direction, a second brush including a first horizontal gear configured to rotate in a first horizontal direction and a second body connected to a lower portion of the first horizontal gear and rotatably connected to the first body, and a third brush including a second vertical gear connected to a surface of the third body that faces the first body, the second vertical gear being configured to rotate in a second vertical direction that is opposite to the first vertical direction, where the first horizontal gear may be engaged with a lower portion of the first vertical gear and a lower portion of the second vertical gear at right angles.

According to an aspect of an example embodiment, a wafer cleaning device may include a first brush assembly provided on an upper surface of a wafer, and a second brush assembly provided on a lower surface of the wafer and facing the first brush assembly, where the first brush assembly may include a first brush including a first body that is cylindrical and a first vertical gear that is connected to a surface of the first body that faces a third body, the first vertical gear being configured to rotate in a first vertical direction, a second brush including a first horizontal gear configured to rotate in a first horizontal direction and a second body connected to a lower portion of the first horizontal gear and rotatably connected to the first body, and a third brush including a second vertical gear connected to a surface of the third body that faces the first body, the second vertical gear being configured to rotate in a second vertical direction that is opposite to the first vertical direction, where the first horizontal gear may be engaged with a lower portion of the first vertical gear and a lower portion of the second vertical gear at right angles and the second brush assembly may include a fourth brush comprising a cylindrical body configured to rotate in the second vertical direction.

According to an aspect of an example embodiment, a wafer cleaning device may include a first brush assembly provided on an upper surface of a wafer and a second brush assembly provided on a lower surface of the wafer and facing the first brush assembly, where the first brush assembly may include a first brush including a first body that is cylindrical and a first vertical gear connected to a surface of the first body that faces a third body, the first vertical gear being configured to rotate in a first vertical direction, a second brush including a first horizontal gear configured to rotate in a first horizontal direction and a second body connected to a lower portion of the first horizontal gear and rotatably connected to the first body, and a third brush including a second vertical gear connected to a surface of the third body that faces the first body, the third brush being configured to rotate in a second vertical direction that is opposite to the first vertical direction, where the second brush assembly may include a fourth brush including a fourth body that is cylindrical and a third vertical gear connected to a surface of the fourth body that faces a sixth body, the third vertical gear being configured to rotate in the second vertical direction, a fifth brush including a third horizontal gear configured to rotate in a second horizontal direction that is opposite to the first horizontal direction and a fifth body connected to an upper portion of the third horizontal gear and rotatably connected to the fourth body, and a sixth brush including a fourth vertical gear connected to a surface of the sixth body that faces the fourth body, the fourth vertical gear being configured to rotate in the first vertical direction, and where the third horizontal gear may be engaged with an upper portion of the third vertical gear and an upper portion of the fourth vertical gear at right angles.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
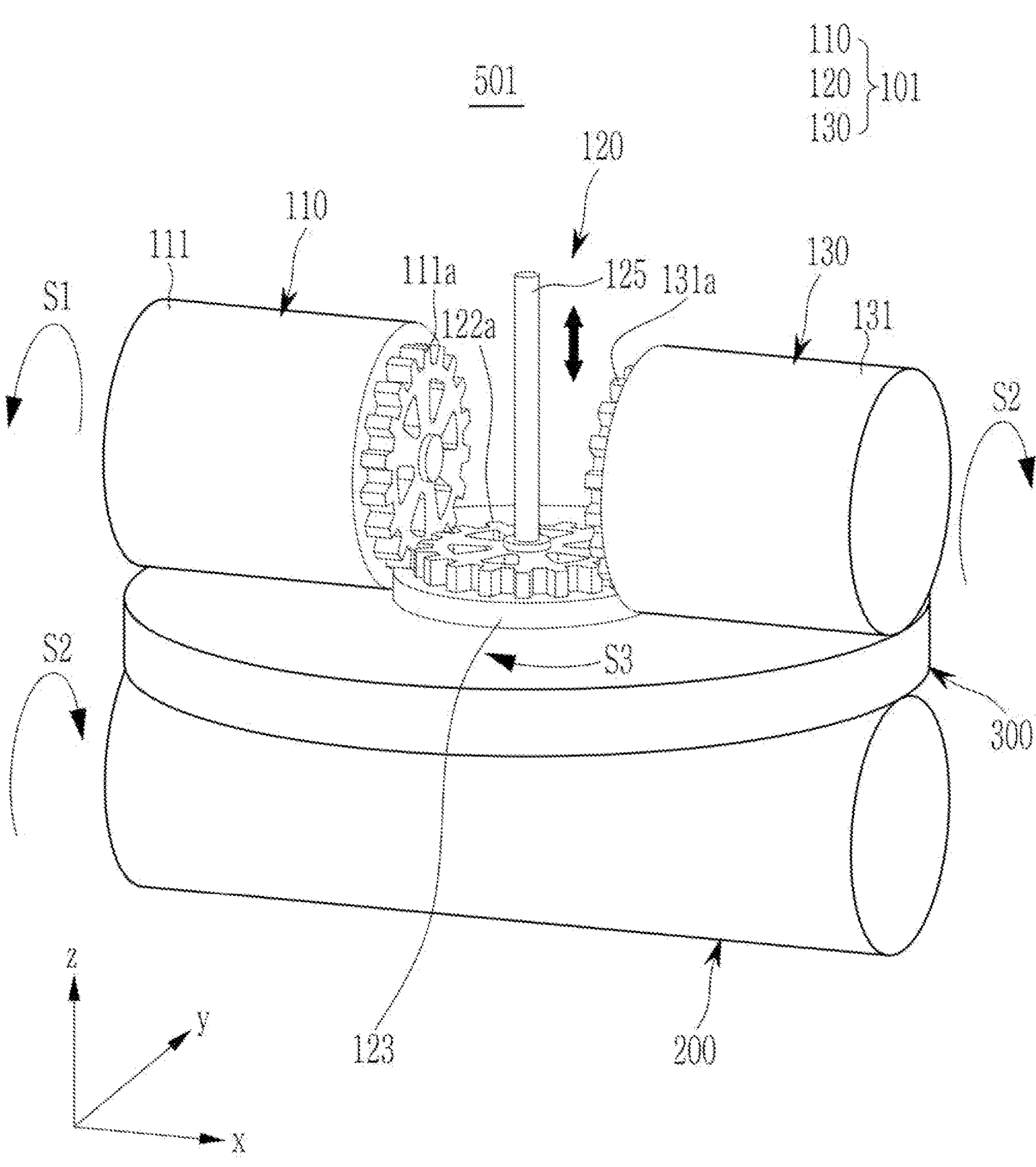
FIGS. 1, 2, 3, 4, 5, 6, 7, 8, 9, 10, 11 and 12 are diagrams illustrating a wafer cleaning device according to various embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

In order to clearly describe the present disclosure, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

After a chemical-mechanical polishing (CMP) process, an impurity (a particle) such as a polishing by-product, a slurry, or the like may remain on a surface of the wafer.

However, in related art, a cylindrical brush has a problem in which uniform cleaning is not performed because an area in which the brush touches (or contacts) a wafer is not uniform during the cleaning process. Specifically, when the cleaning process is performed using the cylindrical brush, more contact is made with a central surface of the wafer than with an edge of the wafer. In particular, when more contact is made with the central surface of the wafer in a CMP process of a metal thin film, an oxide film may be peeled off such that corrosion of the metal thin film may occur. The brush assembly according to embodiments disclosed herein may include a uniform contact region in which the brush assembly contacts the surface of the wafer when the cleaning process is performed such that the cleaning device is capable of performing uniform cleaning while having excellent cleaning power.

FIG. 1 is a diagram illustrating a wafer cleaning device according to an embodiment. The method for removing the particle remaining on the wafer using a brush as shown in FIG. 1 is an effective method in terms of cleaning power.

Referring to FIG. 1, the wafer cleaning device 501 according to an embodiment may be used in a cleaning process of a wafer 300 (e.g., a semiconductor wafer).

In the wafer cleaning device 501, a cleaning liquid may be supplied to the surface of the wafer 300 in a state in which the wafer 300 is rotated in a horizontal direction, and a first brush assembly 101 disposed on an upper surface of the wafer 300 and a second brush assembly 200 disposed on a lower surface of the wafer 300 may also be rotated to contact the surface of the wafer 300. Accordingly, the particle remaining on the surface of the wafer 300 may be removed.

A total length of each of the first brush assembly 101 and the second brush assembly 200 may be slightly longer than a diameter of the wafer 300.

For example, the cleaning liquid supplied during cleaning of the wafer 300 may be one of ultrapure water (DI water), ammonia water ($NH_4OH$), and hydrofluoric acid (HF), but the present disclosure is not limited thereto.

Since the wafer 300 and the first and second brush assemblies 101 and 200 rotate together as described above, efficient cleaning of the wafer 300 may be achieved.

The brush assembly 101 according to an embodiment may include a first brush 110, a second brush 120, and a third brush 130.

The first brush 110 may include a first body 111 rotating in a first vertical direction S1. The first body 111 may have a cylindrical shape having a predetermined height.

A first vertical gear 111*a* rotating in the first vertical direction S1 may be attached to a surface of the first body 111 facing a third body 131.

A core portion that is a rotatable member may be disposed inside the first body 111, and an external movable portion may be connected to the core portion (or a core part) such that the first brush 110 is rotatable in the first vertical direction S1. Accordingly, the first body 111 and the first vertical gear 111*a* may be rotated together by operating the external movable portion (or an external movable part) connected to the core portion disposed inside the first body 111.

The third brush 130 may include the third body 131 rotating in a second vertical direction S2. The third body 131 may have a cylindrical shape having a predetermined height. In some embodiments, the first body 111 and the third body 131 may have the same height, but the present disclosure is not limited thereto.

A second vertical gear 131*a* rotating in the second vertical direction S2 may be attached to a surface of the third body 131 that faces the first body 111.

A core portion that is a rotatable member may be disposed inside the third body 131, and an external movable portion may be connected to the core portion such that the third brush 130 is rotatable in the second vertical direction S2. Accordingly, the third body 131 and the second vertical gear 131*a* may be rotated together by operating the external movable portion (or an external movable part) connected to the core portion disposed inside the third body 131.

In this case, rotation in the first vertical direction S1 may be counterclockwise with respect to a yz plane, and rotation in the second vertical direction S2 may be clockwise with respect to the yz plane. That is, a rotation direction that is the first vertical direction S1 and a rotation direction that is the second vertical direction S2 may be opposite to each other.

The second brush 120 may include a first horizontal gear 122*a* and a second body 123.

The first horizontal gear 122*a* may rotate in a first horizontal direction S3 by meshing with a lower portion of the first vertical gear 111*a* and a lower portion of the second vertical gear 131*a* at right angles. In some embodiments, rotation in the first horizontal direction S3 may be clockwise with respect to an xy plane.

The second body 123 may be attached to a lower portion of the first horizontal gear 122*a*, and may be rotatably connected to the first body 111 and the third body 131. The second body 123 may have a low cylindrical shape, and a lower surface of the second body 123 may be disposed parallel to the wafer 300. Accordingly, a side surface of the second body 123 and a side surface of the first body 111 or the third body 131 may be perpendicular to each other. In this case, a height of the second body 123 is not limited when the height of the second body 123 is thicker than a thickness of the wafer 300.

In some embodiments, the first brush 110, the second brush 120, and the third brush 130 may be simultaneously rotated by operating the external movable portion of the first brush 110 to rotate the first vertical gear 111*a* attached to the first body 111.

Alternatively, the first brush 110, the second brush 120, and the third brush 130 may be simultaneously rotated by operating the external movable portion of the third brush 130 to rotate the second vertical gear 131*a* attached to the third body 131. That is, a movable portion for rotation may not be separately connected to the second brush 120.

A central axis (e.g., an axis of rotation) of the first brush 110 and a central axis of the third brush 130 may be roughly orthogonal to a central axis (a center of rotation) of the wafer 300, and a central axis of the second brush 120 may be roughly coincident with the central axis of the wafer 300. In addition, the total length of the first brush assembly 101 may be longer than the diameter of the wafer 300. Accordingly, as the first brush 110, the second brush 120, and the third brush 130 rotate, an entire upper surface of the wafer 300 may be simultaneously cleaned.

On the other hand, the second brush 120 may further include a first vertical axel 125 that passes through a center of the first horizontal gear 122*a* and is disposed on a central surface of the second body 123.

The first vertical axel 125 may support the second body 123 of the second brush 120, and may simultaneously adjust a pressure applied to the second brush 120 in a vertical direction P1. That is, when a region where the second body 123 contacts the upper surface of the wafer 300 and a region where the first body 111 and the third body 131 contact the upper surface of the wafer 300 are not uniform in the cleaning process, contact uniformity may be secured by controlling a degree of pressurization of the first vertical axel 125.

Specifically, when the first brush assembly 101 contacts a central portion of the wafer 300 more than an edge portion of the wafer 300, a pressure applied to the second body 123 using the first vertical axel 125 may be reduced. Thus, a contact region in which a central surface of the wafer 300 is contacted by the second body 123 may be adjusted to be balanced with a contact region in which an edge surface of the wafer is contacted by the first body 111 and the third body 131.

In some embodiments, the core portions of the first body 111 and the third body 131 may be made of a material such as Teflon. For example, the first body 111, the second body 123, and the third body 131 may be made of polyvinyl alcohol (PVA).

A plurality of protrusions may be included on outer circumferential surfaces of the first and third bodies 111 and 131 and on a surface of the second body 123 that contacts the wafer 300. The plurality of protrusions may be manufactured by a method such as three-dimensional (3D) printing using the same material as that of each of the first body 111, the second body 123, and the third body 131. After the first body 111, the second body 123, and the third body 131 are manufactured, a plurality of protrusions may be additionally attached to side surfaces of the first body 111 and the third body 131. When the protrusions are included, cleaning power may be further improved.

In the present specification, a region where the second body 123 contacts a surface of the wafer 300 may be defined as a central portion of an upper surface, and a region where the first body 111 and the third body 131 contact the surface of the wafer 300 may be defined as an edge portion of the upper surface.

On the other hand, in the first brush assembly 101, the first vertical gear 111*a*, the second vertical gear 131*a*, and the first horizontal gear 122*a* may have the same diameter. In addition, teeth sizes of the first vertical gear 111*a*, the second vertical gear 131*a*, and the first horizontal gear 122*a* may be the same. In this case, a rotational speed (or a rotational velocity) in the vertical direction and a rotational speed in the horizontal direction may be the same. As used herein, the term "same diameter" in reference to gears, teeth, or other components may indicate that the objects have an exact same diameter, substantially the same diameter and/or a substantially similar overall shape and size, as will be understood by one of ordinary skill in the art from the disclosure herein.

Accordingly, the first body 111, the third body 131, and the second body 123 may rotate at the same speed to clean the surface of the wafer 300. In this case, there may be a difference in shapes of the first and third bodies 111 and 131 and the second body 123, such that when the cleaning process is performed by applying the first brush assembly 101, there may be a difference in frictional forces generated by contact with a central portion and an edge portion of the wafer 300. That is, a problem of contact imbalance in which the first brush assembly 101 contacts the central portion of the surface of the wafer 300 more than the edge portion of the surface of the wafer 300 may be solved or mitigated using the difference in frictional forces.

In addition, when contact imbalance occurs, by monitoring the contact regions of the central portion and the edge portion of the wafer 300 while the cleaning process is performed, a pressure applied to the second body 123 may be controlled in the vertical direction P1 using the first vertical axel 125 such that cleaning may be uniformly adjusted.

The cleaning device 501 may include the first brush assembly 101 contacting an upper surface of the wafer 300 and the second brush assembly 200 contacting a lower surface of the wafer 300. The first brush assembly 101 and the second brush assembly 200 may be disposed at a position corresponding to each other with respect to the wafer 300.

A core portion that is a rotatable member may be disposed inside the second brush assembly 200, and an external movable portion may be connected to the core portion such that the second brush assembly is rotatable in the second vertical direction S2. Rotation in the second vertical direction S2 may be clockwise with respect to the yz plane. A central axis of the second brush assembly 200 may be roughly orthogonal to the central axis of the wafer 300 at a position where the second brush assembly 200 corresponds to the first brush assembly 101. In addition, the entire length of the second brush assembly 200 may be longer than the diameter of the wafer 300. Materials constituting the core portion and a body of the second brush assembly 200 may be the same as those described for the first brush assembly 101. In addition, a plurality of protrusions may be included on the outer circumferential surface of the second brush assembly 200.

Since the cleaning device 501 includes the first brush assembly 101 and the second brush assembly 200, upper and lower surfaces of the wafer 300 may be cleaned simultaneously.

Hereinafter, other embodiments will be described with the drawings. In the embodiments described with reference to FIGS. 2-12, the same or similar components as those described with respect to FIG. 1 may be included, and repeated descriptions may be omitted.

Figure 2:
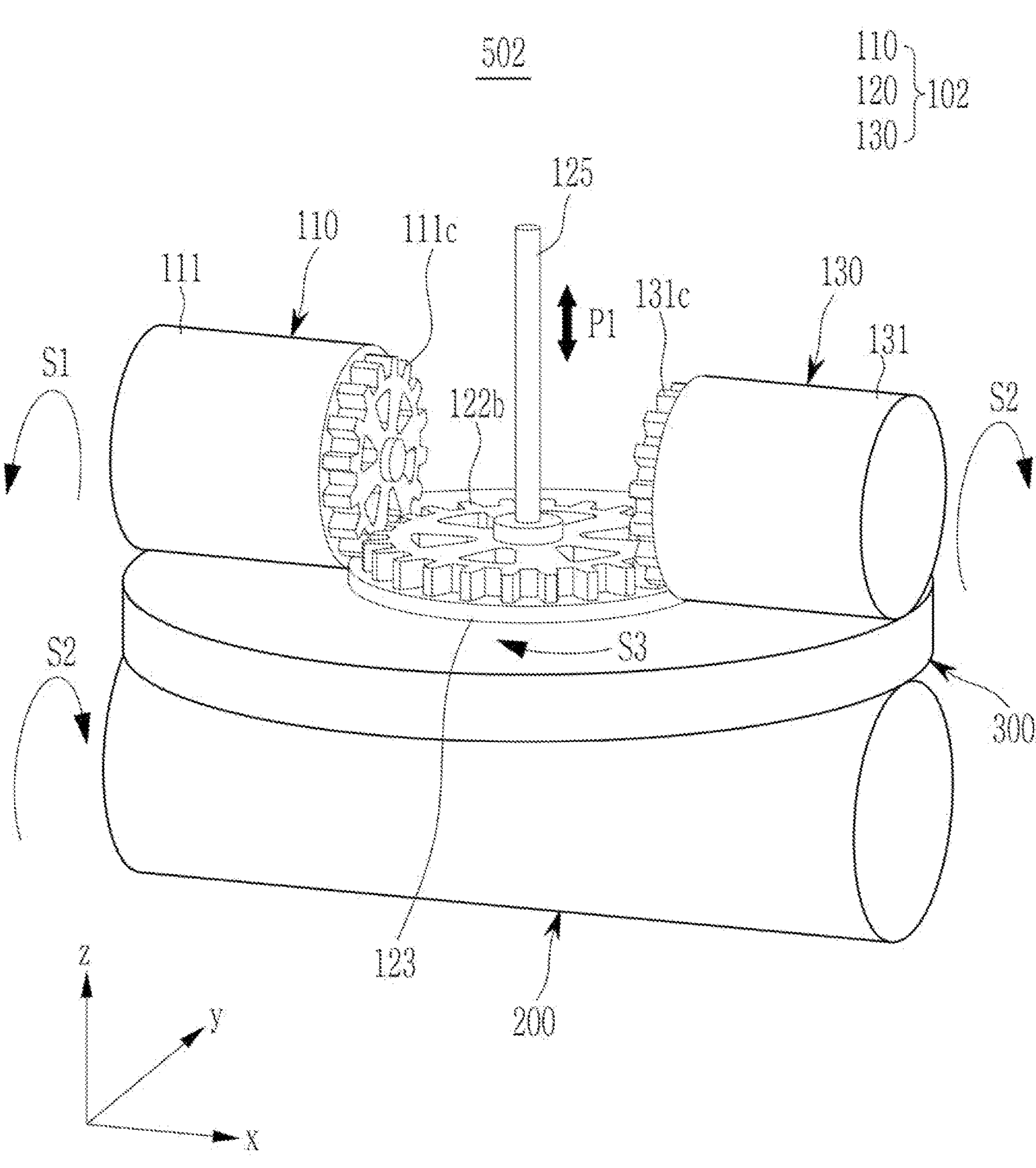

FIG. 2 is a diagram illustrating a wafer cleaning device according to an embodiment. In FIG. 2, diameters of a first vertical gear, a second vertical gear, and a first horizontal gear of the first brush assembly may be different from those shown in FIG. 1.

Specifically, referring to FIG. 2, in the cleaning device 502, the first brush assembly 102 may include the first vertical gear 111*c*, the second vertical gear 131*c*, and the first horizontal gear 122*b*.

The diameters of the first vertical gear 111*c* and the second vertical gear 131*c* may be the same. In addition, the diameter of the first horizontal gear 122*b* may be greater than the diameter of the first vertical gear 111*c* or the second vertical gear 131*c*.

In some embodiments, teeth sizes of the first vertical gear 111*c*, the second vertical gear 131*c*, and the first horizontal gear 122*b* may be the same.

In this case, diameters and rotational speeds of the first and second vertical gears 111*c* and 131*c* and the first horizontal gear 122*b* may be defined by Equation (1).

$$\text{(Rotational speed of the first vertical gear or the second vertical gear)/(Diameter of the first horizontal gear)} = \text{(Rotational speed of the first horizontal gear)/(Diameter of the first vertical gear or the second vertical gear)} \quad (1)$$

Accordingly, the diameters of the first and second vertical gears 111*c* and 131*c* and the diameter of the first horizontal gear 122*b* may be appropriately designed using Equation (1).

In some embodiments, since the diameters of the first and second vertical gears 111*c* and 131*c* are the same, rotational speeds of the first body 111 and the third body 131 may be the same. In addition, since the diameter of the first horizontal gear 122*b* is larger than the diameters of the first and second vertical gears 111*c* and 131*c*, the rotational speeds of the first body 111 and the third body 131 may be faster than a rotational speed of the second body 123.

Therefore, a difference in shape and rotational speed between the first body 111, the third body 131, and the second body 123 may be used in the cleaning process such that there may be a difference in frictional forces generated by contact with a central portion and an edge portion of the surface of the wafer 300. Therefore, a problem of contact imbalance in which the first brush assembly 102 contacts the central portion of the surface of the wafer 300 more than the edge portion of the surface of the wafer 300 may be solved or mitigated using the difference in frictional forces.

Figure 3:
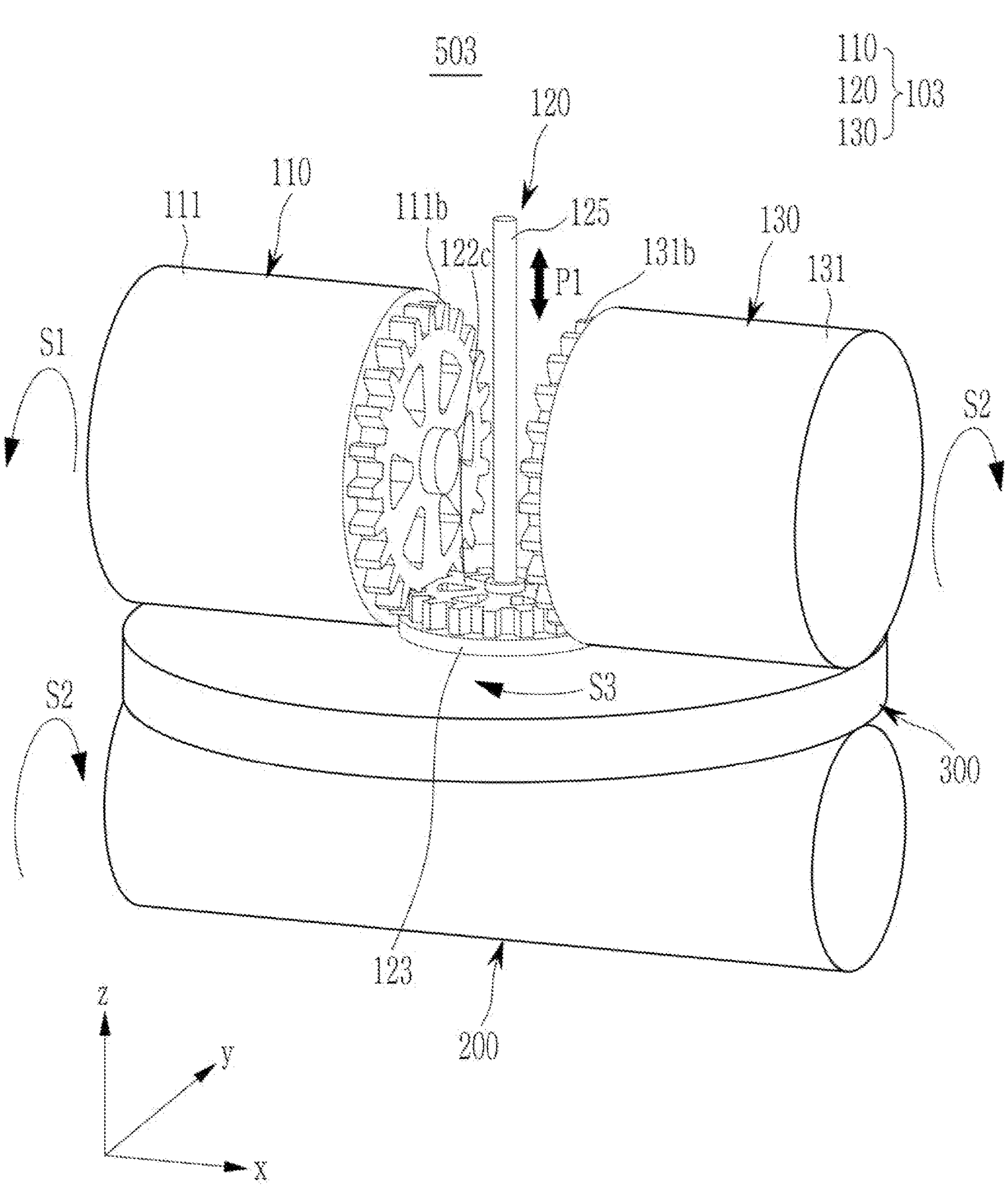

FIG. 3 is a diagram illustrating a wafer cleaning device according to an embodiment. In FIG. 3, diameters of a first vertical gear, a second vertical gear, and a first horizontal gear of the first brush assembly may be different from those shown in FIG. 1.

Specifically, referring to FIG. 3, in the cleaning device 503, the first brush assembly 103 may include the first vertical gear 111*b*, the second vertical gear 131*b*, and the first horizontal gear 122*c*.

The diameters of the first vertical gear 111*b* and the second vertical gear 131*b* may be the same. In addition, the diameter of the first horizontal gear 122*c* may be smaller than the diameter of the first vertical gear 111*b* or the second vertical gear 131*b*.

In some embodiments, teeth sizes of the first vertical gear 111*b*, the second vertical gear 131*b*, and the first horizontal gear 122*b* may be the same.

In this case, diameters and rotational speeds of the first and second vertical gears 111*b* and 131*b* and the first horizontal gear 122*c* may be defined by Equation (1) as described above.

Accordingly, the diameters of the first and second vertical gears 111*b* and 131*b* and the diameter of the first horizontal gear 122*c* may be appropriately designed using Equation (1).

In some embodiments, since the diameters of the first and second vertical gears 111*b* and 131*b* are the same, rotational speeds of the first body 111 and the third body 131 may be the same. In addition, since the diameter of the first horizontal gear 122*c* is smaller than the diameters of the first and second vertical gears 111*b* and 131*b*, the rotational speeds of the first body 111 and the third body 131 may be slower than a rotational speed of the second body 123.

Therefore, a difference in shape and rotational speed between the first body 111, the third body 131, and the second body 123 may be used in the cleaning process such that there may be a difference in frictional forces generated by contact with a central portion and an edge portion of the surface of the wafer 300. Therefore, a problem of contact imbalance in which the first brush assembly 103 contacts the central portion of the surface of the wafer 300 more than the edge portion of the surface of the wafer 300 may be solved or mitigated using the difference in frictional forces.

Figure 4:
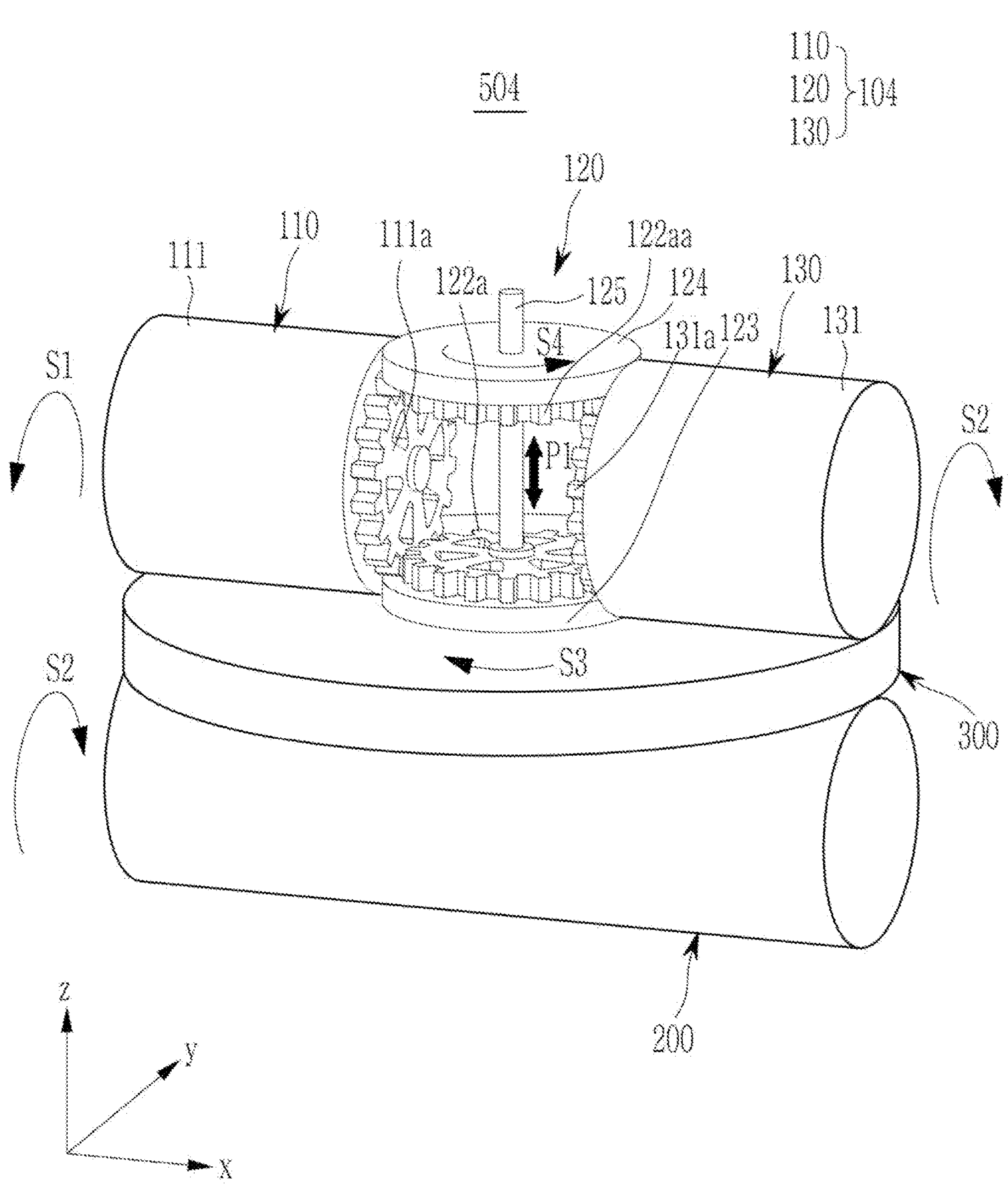

FIG. 4 is a diagram illustrating a wafer cleaning device according to an embodiment. FIG. 4 differs from FIG. 1 in that a second horizontal gear and a first support body are further included in the second brush.

Referring to FIG. 4, in the cleaning device 504, the second brush 120 of the first brush assembly 104 may further include the second horizontal gear 122*aa* that is engaged with upper portions of the first and second vertical gears 111*a* and 131*a* at right angles to rotate in a second horizontal direction S4 that is opposite to the first horizontal direction S3, and the first support body 124 attached to an upper portion of the second horizontal gear 122*aa*. In this case, rotation in the first horizontal direction S3 may be clockwise with respect to the xy plane, and rotation in the second horizontal direction S4 may be counterclockwise.

In some embodiments, the first support body 124 may rotate in an opposite direction to the second body 123, but may not contribute to cleaning of the wafer 300. Specifically, the first support body 124 may uniformly maintain a pressure applied from the first brush 110 and the third brush 130. Thus, the first support body 124 may serve to support the second brush 120 such that the same pressure is applied to upper and lower portions of the second brush 120 in a horizontal direction. Accordingly, the first support body 124 may have the same shape as that of the second body 123, and may have the same diameter and thickness as those of the second body 123.

The first vertical axel 125 passes through centers of the first support body 124, the second horizontal gear 122*aa*, and the first horizontal gear 122*a*, and is disposed on a central surface of the second body 123.

On the other hand, in the first brush assembly 104, diameters of the first vertical gear 111*a*, the second vertical gear 131*a*, the first horizontal gear 122*a*, and the second horizontal gear 122*aa* may be the same. In addition, teeth sizes of the first vertical gear 111*a*, the second vertical gear 131*a*, the first horizontal gear 122*a*, and the second horizontal gear 122*aa* are the same. Therefore, a rotational speed in the vertical direction and a rotational speed in the horizontal direction may be the same.

Figure 5:
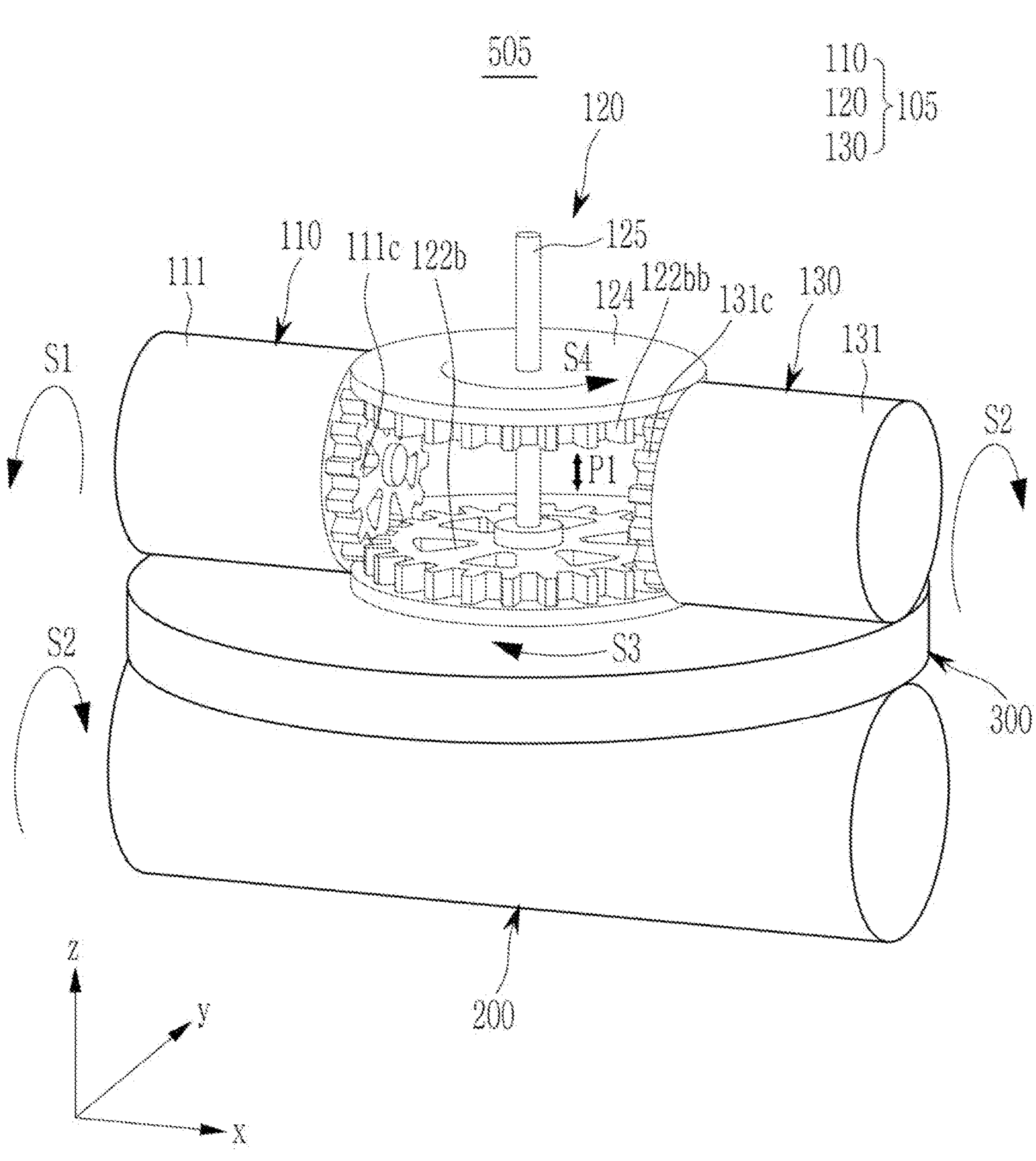

FIG. 5 is a diagram illustrating a wafer cleaning device according to an embodiment. In FIG. 5, diameters of a first vertical gear, a second vertical gear, a first horizontal gear, and a second horizontal gear of the first brush assembly may be different from those of FIG. 4.

Specifically, referring to FIG. 5, in the cleaning device 505, the first brush assembly 105 may include the first vertical gear 111*c*, the second vertical gear 131*c*, the first horizontal gear 122*b*, and the second horizontal gear 122*bb*.

The diameters of the first vertical gear 111*c* and the second vertical gear 131*c* may be the same.

In addition, the diameters of the first horizontal gear 122*b* and the second horizontal gear 122*bb* may be the same.

However, the diameter of the first vertical gear 111*c* or the second vertical gear 131*c* may be smaller than the diameter of the first horizontal gear 122*b* or the second horizontal gear 122*bb*.

Teeth sizes of the first vertical gear 111*c*, the second vertical gear 131*c*, the first horizontal gear 122*b*, and the second horizontal gear 122*bb* may be the same.

In this case, diameters and rotational speeds of the first and second vertical gears 111*c* and 131*c* and the first and second horizontal gears 122*b* and 122*bb* may be defined by Equation (2).

$$\text{(Rotational speed of the first vertical gear or the second vertical gear)}/\text{(Diameter of the first horizontal gear or the second horizontal gear)} = \text{(Rotational speed of the first horizontal gear or the second horizontal gear)}/\text{(Diameter of the first vertical gear or the second vertical gear)} \quad (2)$$

Therefore, the diameters of the first and second vertical gears 111*c* and 131*c* and the diameters of the first and second horizontal gears 122*b* and 122*bb* may be appropriately designed using Equation (2).

Since the diameters of the first and second vertical gears 111*c* and 131*c* are the same, rotational speeds of the first body 111 and the third body 131 may be the same. In addition, since the diameters of the first horizontal gear 122*b* and the second horizontal gear 122*bb* are larger than the diameters of the first and second vertical gears 111*c* and 131*c*, the rotational speeds of the first body 111 and the third body 131 may be faster than a rotational speed of the second body 123.

Therefore, a difference in shape and rotational speed between the first body 111, the third body 131, and the second body 123 may be used in the cleaning process such that there may be a difference in frictional forces generated by contact with a central portion and an edge portion of the surface of the wafer 300. Thus, a problem of contact imbalance in which the first brush assembly 105 contacts the central portion of the surface of the wafer 300 more than the edge portion of the surface of the wafer 300 may be solved or mitigated using the difference in frictional forces.

Figure 6:
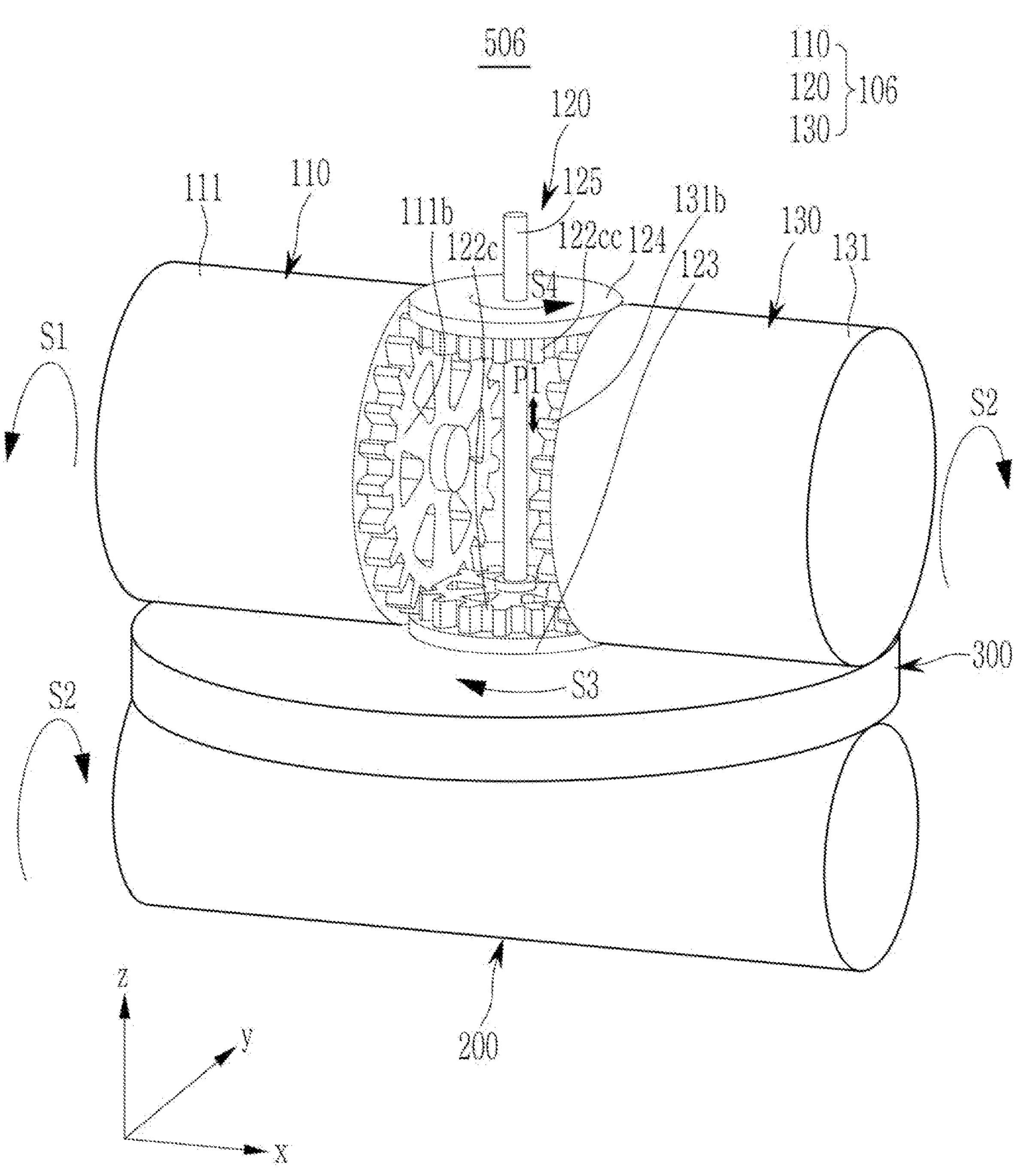

FIG. 6 is a diagram illustrating a wafer cleaning device according to an embodiment. In FIG. 6, diameters of a first vertical gear, a second vertical gear, a first horizontal gear, and a second horizontal gear of the first brush assembly are different from those of FIG. 3.

Specifically, referring to FIG. 6, in the cleaning device 506, the first brush assembly 106 may include the first vertical gear 111*b*, the second vertical gear 131*b*, the first horizontal gear 122*c*, and the second horizontal gear 122*cc*.

The diameters of the first vertical gear 111*b* and the second vertical gear 131*b* may be the same.

In addition, the diameters of the first horizontal gear 122*c* and the second horizontal gear 122*cc* may be the same.

However, the diameter of the first vertical gear 111*b* or the second vertical gear 131*b* may be greater than the diameter of the first horizontal gear 122*c* or the second horizontal gear 122*cc*.

In some embodiments, teeth sizes of the first vertical gear 111*b*, the second vertical gear 131*b*, the first horizontal gear 122*c*, and the second horizontal gear 122*cc* may be the same.

In this case, diameter and rotational speeds of the first and second vertical gears 111*b* and 131*b* and the first and second horizontal gears 122*c* and 122*cc* may be defined by Equation (2) as described above.

Therefore, the diameters of the first and second vertical gears 111*b* and 131*b* and the diameters of the first and second horizontal gears 122*c* and 122*cc* may be appropriately designed using Equation (2).

In some embodiments, since the diameters of the first and second vertical gears 111*b* and 131*b* are the same, rotational speeds of the first body 111 and the third body 131 may be the same. In addition, since the diameters of the first horizontal gear 122*c* and the second horizontal gear 122*cc* are smaller than the diameters of the first and second vertical gears 111*b* and 131*b*, the rotational speeds of the first body 111 and the third body 131 may be slower than a rotational speed of the second body 123.

Therefore, a difference in shape and rotational speed between the first body 111, the third body 131, and the second body 123 may be used in the cleaning process such that there may be a difference in frictional forces generated by contact with a central portion and an edge portion of the surface of the wafer 300. Thus, a problem of contact imbalance in which the first brush assembly 106 contacts the central portion of the surface of the wafer 300 more than the edge portion of the surface of the wafer 300 may be solved or mitigated using the difference in frictional forces.

Figure 7:
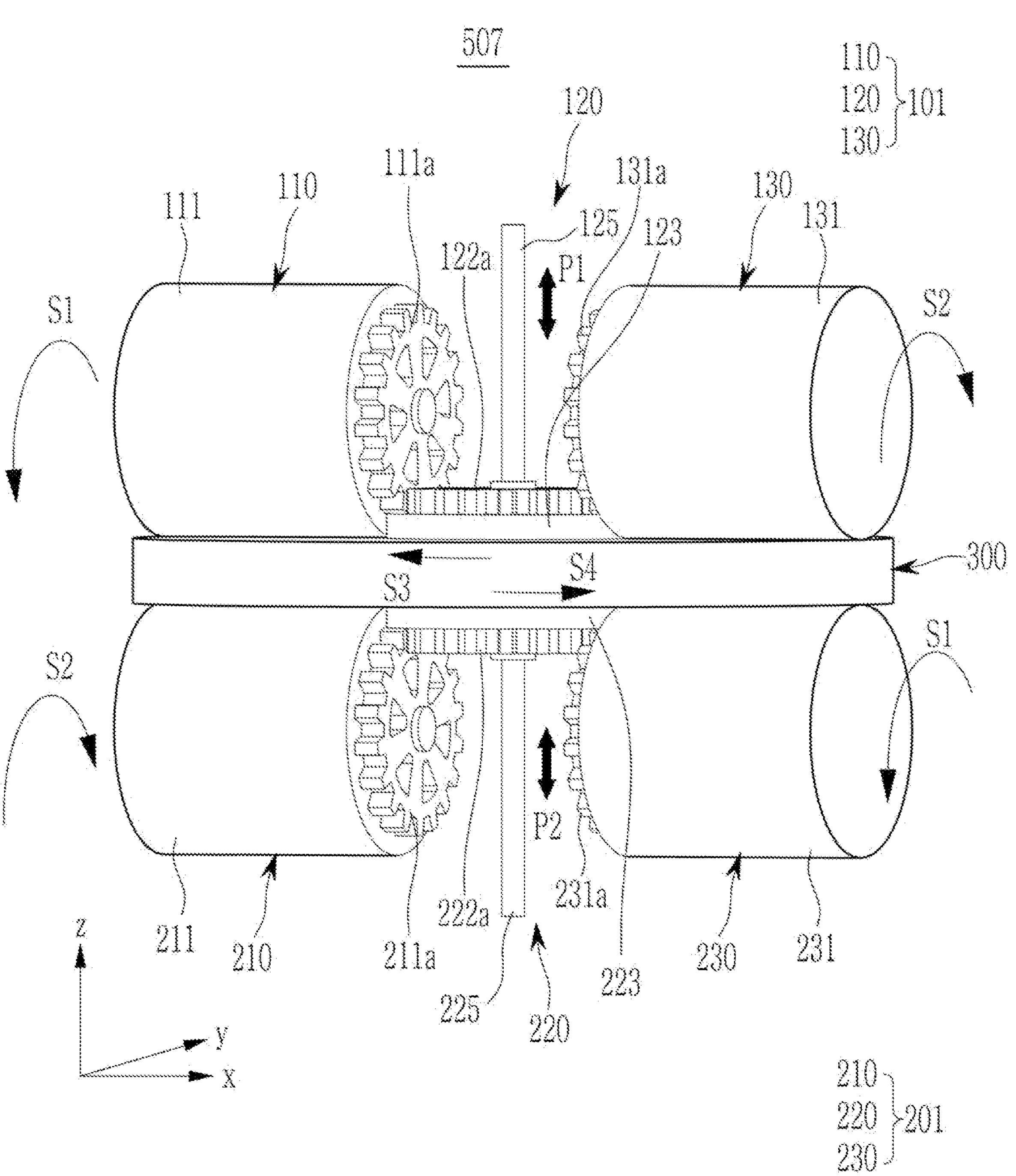

FIG. 7 is a diagram illustrating a wafer cleaning device according to an embodiment. FIG. 7 is different from FIG. 1 in that the second brush assembly includes a fourth brush, a fifth brush, and a sixth brush.

Referring to FIG. 7, the second brush assembly 201 may include the fourth brush 210, the fifth brush 220, and the sixth brush 230.

The fourth brush 210 may include a fourth body 211 rotating in the second vertical direction S2. The fourth body 211 may have a cylindrical shape having a predetermined height.

A third vertical gear 211*a* rotating in the second vertical direction S2 may be attached to a surface of the fourth body 211 facing a sixth body 231.

A core portion that is a rotatable member may be disposed inside the fourth body 211, and an external movable portion may be connected to the core portion such that the fourth brush 210 is rotatable in the second vertical direction S2. Accordingly, the fourth body 211 and the third vertical gear 211*a* may be rotated together by operating the external movable portion connected to the core portion disposed inside the fourth body 211.

The sixth brush 230 may include the sixth body 231 rotating in the first vertical direction S1.

The sixth body 231 may have a cylindrical shape having a predetermined height. The fourth body 211 and the sixth body 231 may have the same height, but the present disclosure is not limited thereto.

A fourth vertical gear 231*a* rotating in the first vertical direction S1 may be attached to a surface of the sixth body 231 facing the fourth body 211.

A core portion that is a rotatable member may be disposed inside the sixth body 231, and an external movable portion may be connected to the core portion such that the sixth brush 230 is rotatable in the first vertical direction S1. Accordingly, the sixth body 231 and the fourth vertical gear 231*a* may be rotated together by operating the external movable portion connected to the core portion disposed inside the sixth body 231.

In this case, rotation in the first vertical direction S1 may be counterclockwise with respect to the yz plane, and rotation in the second vertical direction S2 may be clockwise with respect to the yz plane. That is, a rotation direction that is the first vertical direction S1 and a rotation direction that is the second vertical direction S2 may be opposite to each other.

The fifth brush 220 may include a third horizontal gear 222*a* and a fifth body 223.

The third horizontal gear 222*a* may be meshed with lower portions of the third vertical gear 211*a* and the fourth vertical gear 231*a* at right angles to rotate in a second horizontal direction S4. Rotation in the second horizontal direction S4 may be counterclockwise with respect to the xy plane.

The fifth body 223 may be attached to an upper portion of the third horizontal gear 222*a*, and may be rotatably connected to the fourth body 211 and the sixth body 231. The fifth body 223 may have a low cylindrical shape, and a lower surface of the fifth body 223 may be disposed parallel to the wafer 300. Accordingly, a side surface of the fifth body 223 and a side surface of the fourth body 211 or the sixth body 231 may be perpendicular to each other. In this case, a height of the fifth body 223 is not particularly limited given that the height of the fifth body 223 is thicker than the thickness of the wafer 300.

The fourth brush 210, the fifth brush 220, and the sixth brush 230 may be simultaneously rotated by operating the external movable portion of the fourth brush 210 to rotate the third vertical gear 211*a* attached to the fourth body 211.

Alternatively, the fourth brush 210, the fifth brush 220, and the sixth brush 230 may be simultaneously rotated by operating the external movable portion of the sixth brush 230 to rotate the fourth vertical gear 231*a* attached to the sixth body 231. That is, a movable portion for rotation may not be separately connected to the fifth brush 220.

A central axis of the fourth brush 210 and a central axis of the sixth brush 230 may be roughly orthogonal to a central axis of the wafer 300, and the fourth brush 210 and the sixth brush 230 may be parallel to the first brush 110 and the third brush 130 of the first brush assembly 101.

In addition, a central axis of the fifth brush 220 may be roughly coincident with the central axis of the wafer 300. Therefore, the axis of rotation of the fifth brush 220 may be roughly coincident with a central axis of the second brush 120.

In addition, a total length of the second brush assembly 201 may be longer than the diameter of the wafer 300. Accordingly, as the fourth brush 210, the fifth brush 220, and the sixth brush 230 rotate, an entire lower surface of the wafer 300 may be simultaneously cleaned.

On the other hand, the fifth brush 220 may further include a second vertical axel 225 that passes through a center of the third horizontal gear 222*a* and is disposed on a central surface of the fifth body 223.

The second vertical axel 225 may support the fifth body 223 of the fifth brush 220, and may simultaneously adjust a pressure applied to the fifth brush 220 in a vertical direction P2. That is, when a region where the fifth body 223 contacts the lower surface of the wafer 300 and a region where the fourth body 211 and the sixth body 231 contact the lower surface of the wafer 300 are not uniform in the cleaning process, contact uniformity may be secured by controlling a degree of pressurization of the second vertical axel 225.

Specifically, when the second brush assembly 201 contacts a central portion of the lower surface of the wafer 300 more than an edge portion of the lower surface of the wafer 300, a pressure applied to the fifth body 223 using the second vertical axel 225 may be reduced. Thus, a contact region in which the central portion of the lower surface of the wafer 300 is contacted by the fifth body 223 may be adjusted to be balanced with a contact region in which the edge portion of the lower surface of the wafer is contacted by the fourth body 211 and the sixth body 231.

In some embodiments, materials of the core portions of the fourth body 211 and the sixth body 231 and materials of the fourth body 211, the fifth body 223, and the sixth body 231 may be the same as those described above (e.g., the same as those of FIG. 1).

In addition, similarly to the first brush assembly 101, a plurality of protrusions may be included on outer circumferential surfaces of the fourth body 211 and the sixth body 231 and on a surface of the fifth body 223 that contacts the wafer 300. A material and a forming method of the protrusions may be the same as those described in the first embodiment.

In the present specification, a region where the fifth body 223 contacts a surface of the wafer 300 may be defined as a central portion of a lower surface, and a region where the fourth body 211 and the sixth body 231 contact the surface of the wafer 300 may be defined as an edge portion of the lower surface.

On the other hand, in the second brush assembly 201, the third vertical gear 211*a*, the fourth vertical gear 231*a*, and the third horizontal gear 222*a* may have the same diameter. In addition, teeth sizes of the third vertical gear 211*a*, the fourth vertical gear 231*a*, and the third horizontal gear 222*a* may be the same. In this case, a rotational speed in the vertical direction and a rotational speed in the horizontal direction may be the same.

Accordingly, the fourth body 211, the sixth body 231, and the fifth body 223 may rotate at the same speed to clean the lower surface of the wafer 300. In this case, there is a difference in shapes of the fourth and sixth bodies 211 and 231 and the fifth body 223, such that when the cleaning process is performed by applying the second brush assembly 201, there may be a difference in frictional forces generated by contact with a central portion and an edge portion of the lower surface of the wafer 300. That is, problem of contact imbalance in which the second brush assembly 201 contacts the central portion of the lower surface of the wafer 300 more than the edge portion of the lower surface of the wafer 300 may be solved or mitigated using the difference in frictional forces.

In addition, when contact imbalance occurs by monitoring the contact regions of the central portion and the edge portion of the wafer 300 while the cleaning process is performed, a pressure applied to the fifth body 223 may be controlled in the vertical direction P2 using the second vertical axel 225 such that cleaning may be uniformly adjusted.

The cleaning device 507 may include the first brush assembly 101 contacting an upper surface of the wafer 300 and the second brush assembly 201 contacting a lower surface of the wafer 300, and the first brush assembly 101 and the second brush assembly 201 may be disposed at a position corresponding to each other with respect to the wafer 300.

Since the cleaning device 507 includes the first brush assembly 101 and the second brush assembly 201, upper and lower surfaces of the wafer 300 may be uniformly cleaned at the same time.

Figure 8:
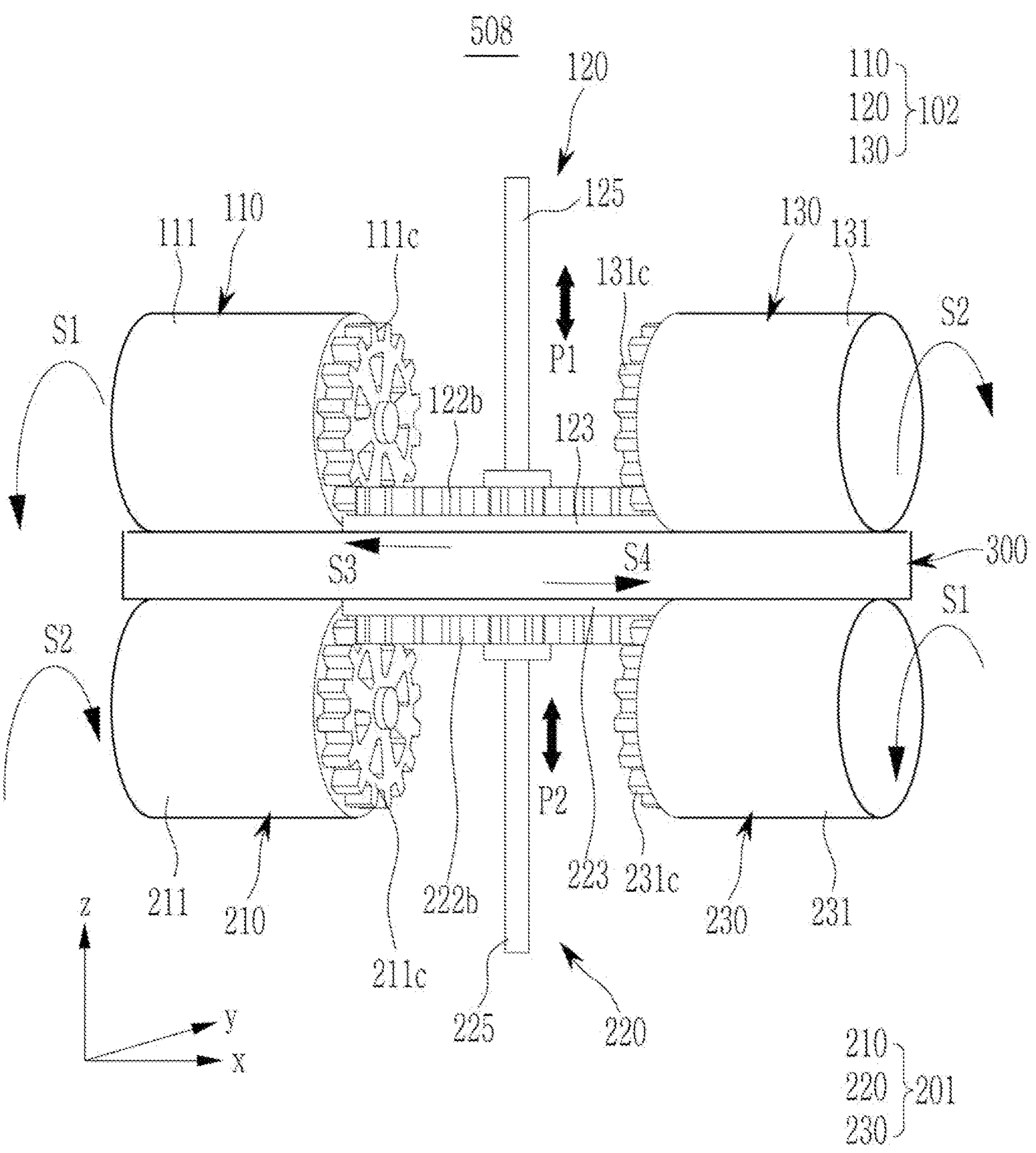

FIG. 8 is a diagram illustrating a wafer cleaning device according to an embodiment. In FIG. 8, diameters of a third vertical gear, a fourth vertical gear, and a third horizontal gear of the second brush assembly may be different from those in FIG. 7.

Specifically, referring to FIG. 8, in the cleaning device 508, the second brush assembly 202 may include the third vertical gear 211*c*, the fourth vertical gear 231*c*, and the third horizontal gear 222*b*.

The third vertical gear 211*c*, the fourth vertical gear 231*c*, and the third horizontal gear 222*b* may be the same as the first vertical gear 111*c*, the second vertical gear 131*c* of the first brush assembly 102 of the second embodiment, and the first horizontal gear 122*b* and repeated descriptions may be omitted herein.

Figure 9:
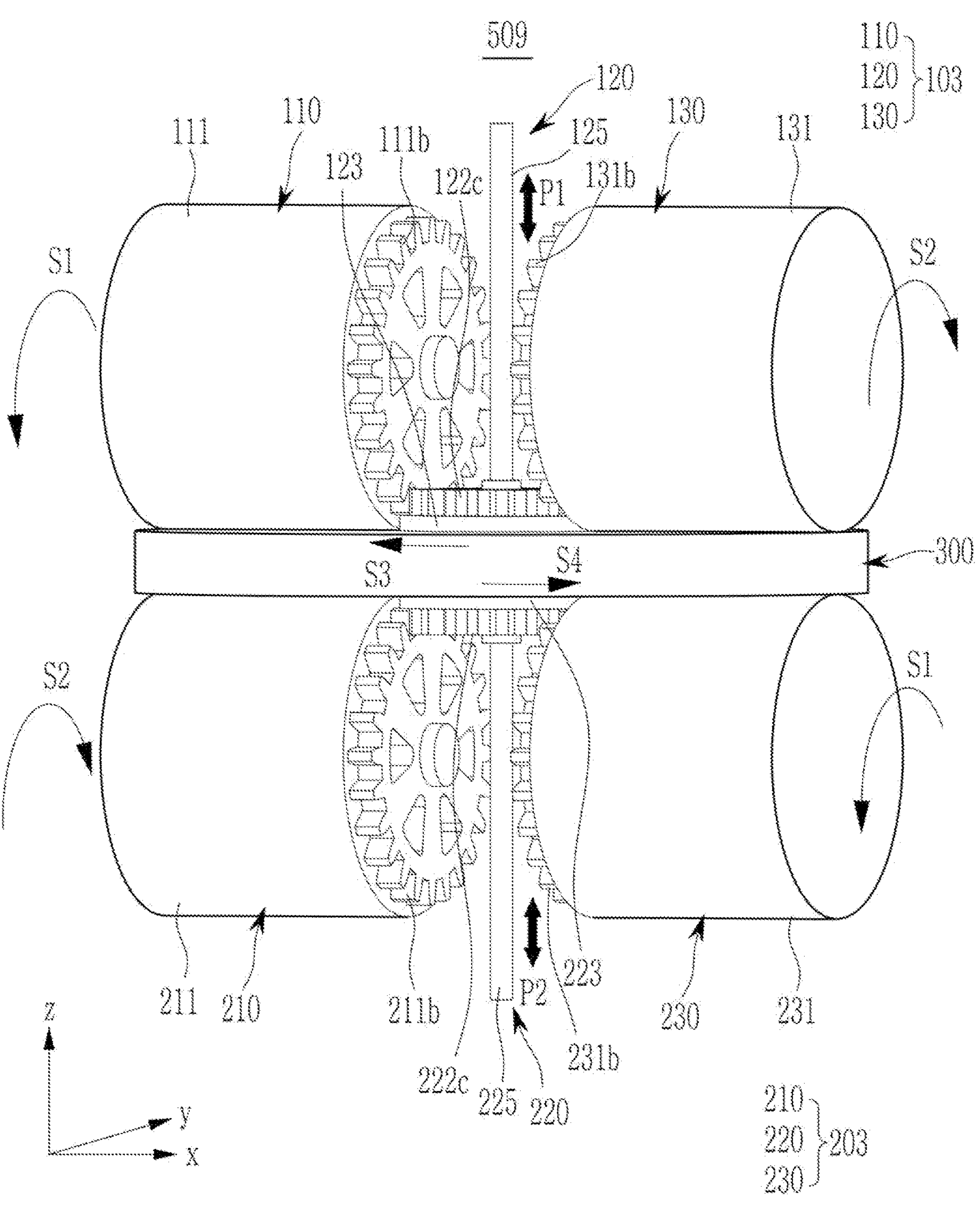

FIG. 9 is a diagram illustrating a wafer cleaning device according to an embodiment. In FIG. 9, diameters of a third vertical gear, a fourth vertical gear, and a third horizontal gear of the second brush assembly may be different from those in FIG. 7.

Specifically, referring to FIG. 9, in the cleaning device 509, the second brush assembly 203 may include the third vertical gear 211*b*, the fourth vertical gear 231*b*, and the third horizontal gear 222*c*.

The third vertical gear 211*b*, the fourth vertical gear 231*b*, and the third horizontal gear 222*c* may be the same as the first vertical gear 111*b*, the second vertical gear 131*b*, and the first horizontal gear 122*c* of the first brush assembly 103 of FIG. 3, and repeated descriptions may be omitted herein.

Figure 10:
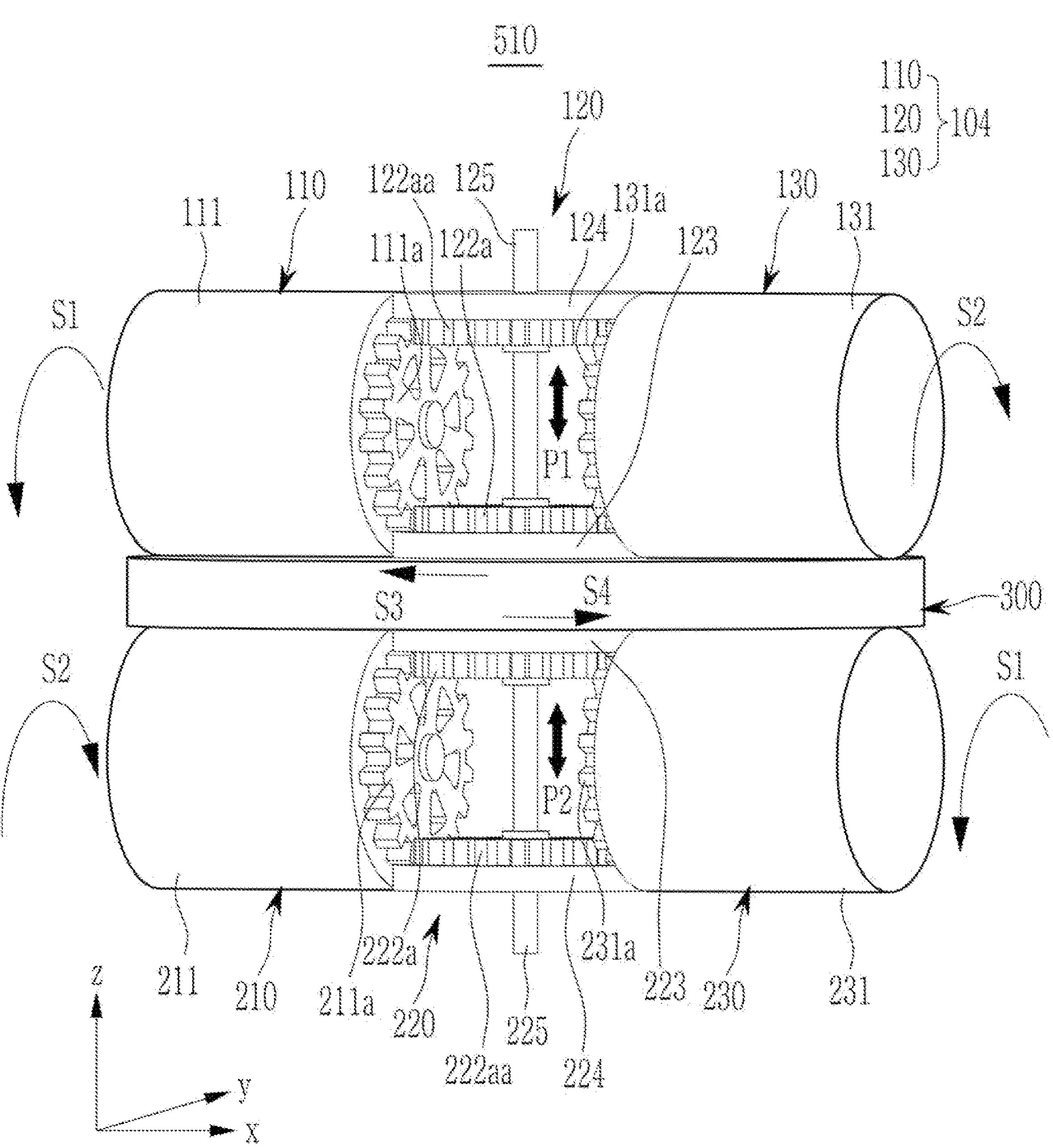

FIG. 10 is a diagram illustrating a wafer cleaning device according to an embodiment. FIG. 10 may be different from the FIG. 7 in that the fifth brush may further include a fourth horizontal gear and a second support body.

Referring to FIG. 10, in the cleaning device 510, the fifth brush 220 of the second brush assembly 204 may further include the fourth horizontal gear 222*aa* that is engaged with upper portions of the third and fourth vertical gears 211*a* and 231*a* at right angles to rotate in the second horizontal direction S4 that is opposite to the first horizontal direction S3, and the second support body 224 attached to a lower portion of the fourth horizontal gear 222*aa*. In this case, rotation in the first horizontal direction S3 may be clockwise with respect to the xy plane, and rotation in the second horizontal direction S4 may be counterclockwise.

The fourth horizontal gear 222*aa* and the second support body 224 may be the same the second horizontal gear 122*aa* and the first support body 124 of the first brush assembly 104 of FIG. 4, and repeated descriptions may be omitted herein.

Figure 11:
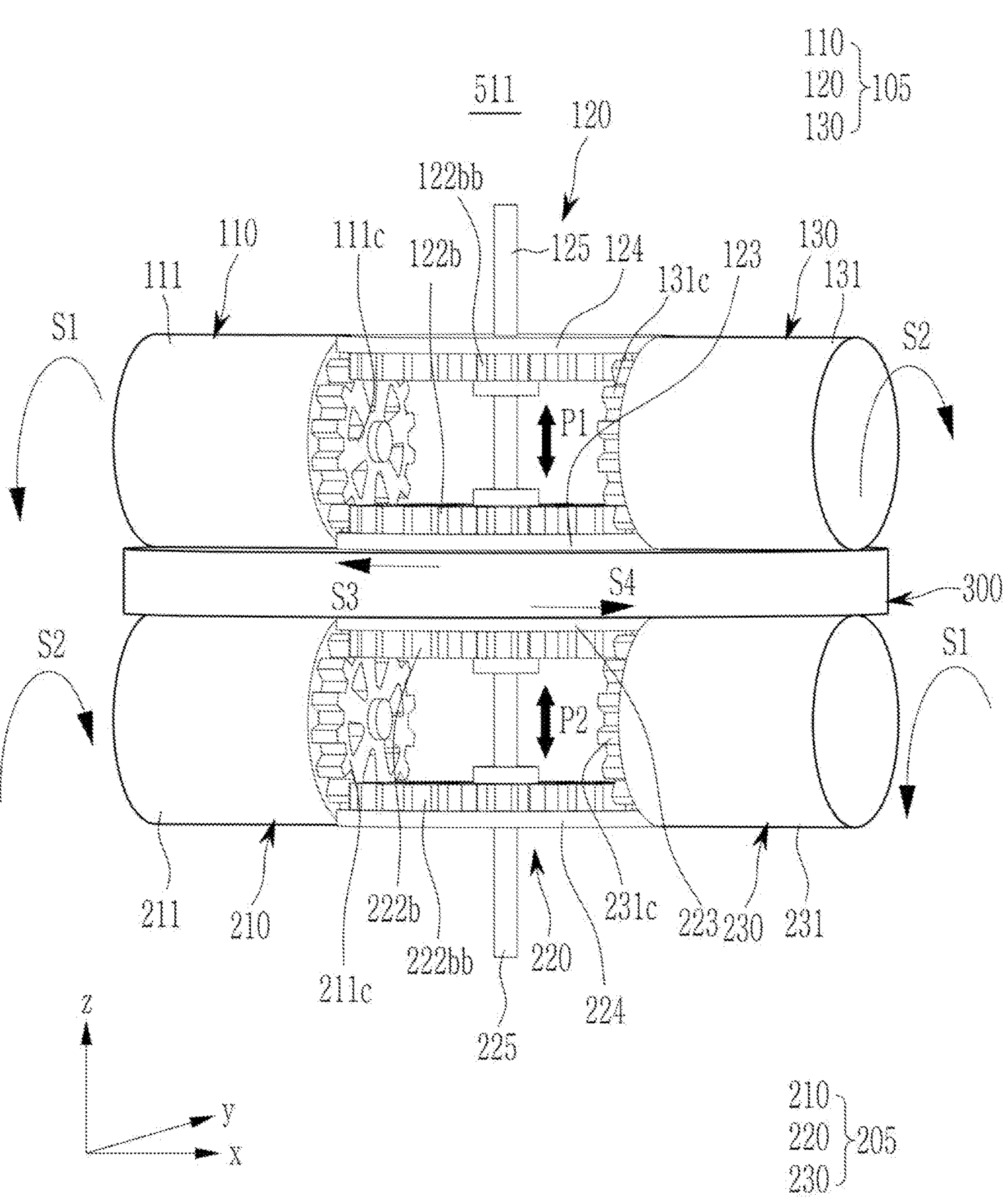

FIG. 11 is a diagram illustrating a wafer cleaning device according to an embodiment. In FIG. 11, diameters of a third vertical gear, a fourth vertical gear, a third horizontal gear, and a fourth horizontal gear of the second brush assembly may be different from those in FIG. 10.

Specifically, referring to FIG. 11, in the cleaning device 511, the second brush assembly 205 may include the third vertical gear 211*c*, the fourth vertical gear 231*c*, the third horizontal gear 222*b*, and the fourth horizontal gear 222*bb*.

The third vertical gear 211*c*, the fourth vertical gear 231*c*, the third horizontal gear 222*b*, and the fourth horizontal gear 222*bb* may be the same the first vertical gear 111*c*, the second vertical gear 131*c*, the first horizontal gear 122*b*, and the second horizontal gear 122*bb* of the first brush assembly 105 of FIG. 5, and repeated descriptions may be omitted herein.

Figure 12:
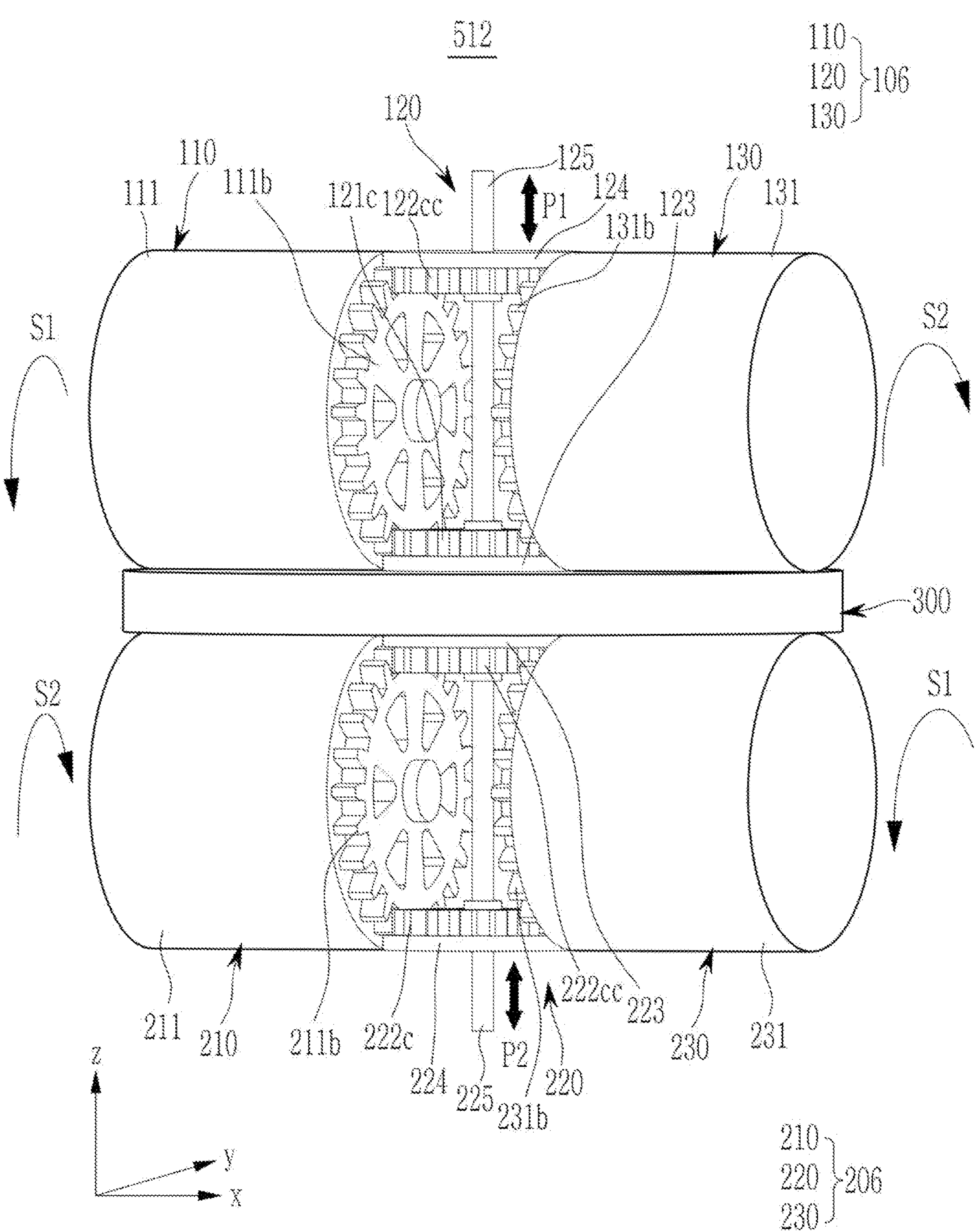

FIG. 12 is a diagram illustrating a wafer cleaning device according to an embodiment. In some embodiments, diameters of a third vertical gear, a fourth vertical gear, a third horizontal gear, and a fourth horizontal gear of the second brush assembly may be different from those in FIG. 10.

Specifically, referring to FIG. 12, in the cleaning device 512, the second brush assembly 206 may include the third vertical gear 211*b*, the fourth vertical gear 231*b*, the third horizontal gear 222*c*, and the fourth horizontal gear 222*cc*.

The third vertical gear 211*b*, the fourth vertical gear 231*b*, the third horizontal gear 222*c*, and the fourth horizontal gear 222*cc* may be the same the first vertical gear 111*b*, the second vertical gear 131*b*, the first horizontal gear 122*c*, and the second horizontal gear 122*cc* of the first brush assembly 106 of FIG. 6, and repeated descriptions may be omitted herein.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A brush assembly configured to clean a wafer, comprising a first brush comprising:

a first body that is cylindrical; and a first vertical gear connected to a surface of the cylindrical first body that faces a third body, the first vertical gear being configured to rotate in a first vertical direction;

a second brush comprising:

a first horizontal gear configured to rotate in a first horizontal direction; and a second body connected to a lower portion of the first horizontal gear and rotatably connected to the first body; and a third brush comprising a second vertical gear connected to a surface of the third body that faces the first body, the second vertical gear being configured to rotate in a second vertical direction that is opposite to the first vertical direction, wherein the first horizontal gear is engaged with a lower portion of the first vertical gear and a lower portion of the second vertical gear at right angles.

2. The brush assembly of claim 1, wherein the second brush further comprises a first vertical axel passing through a center of the first horizontal gear; and wherein the first vertical axel is provided on a central surface of the second body.

3. The brush assembly of claim 1, wherein a diameter of the first vertical gear is substantially the same as a diameter of the second vertical gear, and wherein a diameter of the first horizontal gear is substantially the same as the diameter of the first vertical gear or the diameter of the second vertical gear.

4. The brush assembly of claim 1, wherein the second brush further comprises:

a second horizontal gear engaged with an upper portion of the first vertical gear and an upper portion of the second vertical gear, and at right angles, such that the second horizontal gear is configured to rotate in a second horizontal direction that is opposite to the first horizontal direction; and a first support body connected to an upper portion of the second horizontal gear.

5. The brush assembly of claim 4, wherein the second brush further comprises a second vertical axel passing through centers of the first support body, the second horizontal gear, and the first horizontal gear, the second vertical axel being provided on a central surface of the second body.

6. The brush assembly of claim 4, wherein a diameter of the first vertical gear is substantially the same as a diameter of the second vertical gear, wherein a diameter of the first horizontal gear is substantially the same as a diameter of the second horizontal gear, and wherein the diameter of the first vertical gear or the diameter of the second vertical gear is substantially the same as the diameter of the first horizontal gear or the diameter of the second horizontal gear.

7. A wafer cleaning device, comprising:

a first brush assembly provided on an upper surface of a wafer; and a second brush assembly provided on a lower surface of the wafer and facing the first brush assembly, wherein the first brush assembly comprises:

a first brush comprising:

a first body that is cylindrical; and a first vertical gear that is connected to a surface of the first body that faces a third body, the first vertical gear being configured to rotate in a first vertical direction;

a second brush comprising:

a first horizontal gear configured to rotate in a first horizontal direction; and a second body connected to a lower portion of the first horizontal gear and rotatably connected to the first body; and a third brush comprising a second vertical gear connected to a surface of the third body that faces the first body, the second vertical gear being configured to rotate in a second vertical direction that is opposite to the first vertical direction, wherein the first horizontal gear is engaged with a lower portion of the first vertical gear and a lower portion of the second vertical gear at right angles, and wherein the second brush assembly further comprises a fourth brush comprising a cylindrical body configured to rotate in the second vertical direction.

8. The wafer cleaning device of claim 7, wherein the second brush further includes a first vertical axel passing through a center of the first horizontal gear and provided on a center of the second body.

9. The wafer cleaning device of claim 7, wherein a diameter of the first vertical gear is substantially the same as a diameter of the second vertical gear, and wherein a diameter of the first horizontal gear is substantially the same as the diameter of the first vertical gear or the diameter of the second vertical gear.

10. The wafer cleaning device of claim 7, wherein the second brush further comprises:

a second horizontal gear engaged with an upper portion of the first vertical gear and an upper portion of the second vertical gear at right angles, the second horizontal gear being configured to rotate in a second horizontal direction that is opposite to the first horizontal direction; and a first support body connected to an upper portion of the second horizontal gear.

11. The wafer cleaning device of claim 10, wherein the second brush further comprises a first vertical axel passing through centers of the first support body, the second horizontal gear, and the first horizontal gear, and wherein the first vertical axel is provided on a central surface of the second body.

12. The wafer cleaning device of claim 10, wherein a diameter of the first vertical gear is substantially the same as a diameter of the second vertical gear, wherein a diameter of the first horizontal gear is substantially the same as a diameter of the second horizontal gear, and wherein the diameter of the first vertical gear or the second vertical gear is substantially the same as the diameter of the first horizontal gear or the second horizontal gear.

13. A wafer cleaning device, comprising:

a first brush assembly provided on an upper surface of a wafer; and a second brush assembly provided on a lower surface of the wafer and facing the first brush assembly, wherein the first brush assembly comprises:

a first brush comprising:

a first body that is cylindrical; and a first vertical gear connected to a surface of the first body that faces a third body, the first vertical gear being configured to rotate in a first vertical direction;

a second brush comprising:

a first horizontal gear configured to rotate in a first horizontal direction, and a second body connected to a lower portion of the first horizontal gear and rotatably connected to the first body; and a third brush comprising a second vertical gear connected to a surface of the third body that faces the first body, the third brush being configured to rotate in a second vertical direction that is opposite to the first vertical direction, wherein the first horizontal gear is engaged with a lower portion of the first vertical gear and a lower portion of the second vertical gear at right angles, wherein the second brush assembly comprises:

a fourth brush comprising:

a fourth body that is cylindrical; and a third vertical gear connected to a surface of the fourth body that faces a sixth body, the third vertical gear being configured to rotate in the second vertical direction;

a fifth brush comprising:

a third horizontal gear configured to rotate in a second horizontal direction that is opposite to the first horizontal direction, and a fifth body connected to an upper portion of the third horizontal gear and rotatably connected to the fourth body; and a sixth brush comprising a fourth vertical gear connected to a surface of the sixth body that faces the fourth body, the fourth vertical gear being configured to rotate in the first vertical direction, and wherein the third horizontal gear is engaged with an upper portion of the third vertical gear and an upper portion of the fourth vertical gear at right angles.

14. The wafer cleaning device of claim 13, wherein the second brush further comprises a first vertical axel passing through a center of the first horizontal gear and provided on a central surface of the second body, and wherein the fifth brush further comprises a second vertical axel passing through a center of the third horizontal gear and provided on a central surface of the fifth body.

15. The wafer cleaning device of claim 13, wherein a diameter of the first vertical gear is substantially the same as a diameter of the second vertical gear, wherein a diameter of the first horizontal gear is substantially the same as the diameter of the first vertical gear or the diameter of the second vertical gear, wherein a diameter of the third vertical gear is substantially the same as a diameter of the fourth vertical gear, and wherein a diameter of the third horizontal gear is substantially the same as the diameter of the third vertical gear or the diameter of the fourth vertical gear.

16. The wafer cleaning device of claim 13, wherein the second brush further comprises:

a second horizontal gear engaged with an upper portion of the first vertical gear and an upper portion of the second vertical gear at right angles, the second horizontal gear being configured to rotate in the second horizontal direction; and a first support body connected to an upper portion of the second horizontal gear, and wherein the fifth brush further comprises:

a fourth horizontal gear engaged with a lower portion of the third vertical gear and a lower portion of the fourth vertical gear at right angles, the fourth horizontal gear being configured to rotate in the first horizontal direction; and a second support body connected to a lower portion of the fourth horizontal gear.

17. The wafer cleaning device of claim 16, wherein the second brush further comprises a first vertical axel passing through centers of the first support body, the second horizontal gear, and the first horizontal gear, the first vertical axel being provided on a central surface of the second body, and wherein the fifth brush further comprises a second vertical axel passing through centers of the second support body, the fourth horizontal gear, and the third horizontal gear, the second vertical axel being provided on a central surface of the fifth body.

18. The wafer cleaning device of claim 16, wherein the first vertical gear, the second vertical gear, the first horizontal gear, and the second horizontal gear have substantially the same diameter, and wherein the third vertical gear, the fourth vertical gear, the third horizontal gear, and the fourth horizontal gear have substantially the same diameter.

19. The wafer cleaning device of claim 16, wherein a diameter of the first vertical gear is substantially the same as a diameter of the second vertical gear, wherein a diameter of the first horizontal gear is substantially the same as a diameter of the second horizontal gear, and wherein the diameter of the first horizontal gear or the diameter of the second horizontal gear is greater than the diameter of the first vertical gear or the diameter of the second vertical gear.

20. The wafer cleaning device of claim 16, wherein a diameter of the first vertical gear is substantially the same as the second vertical gear, wherein a diameter of the first horizontal gear is substantially the same as a diameter of the second horizontal gear, and wherein the diameter of the first horizontal gear or the diameter of the second horizontal gear is less than the diameter of the first vertical gear or the diameter of the second vertical gear.

* * * * *